United States Patent
Tanaka et al.

[11] Patent Number: 5,908,671
[45] Date of Patent: Jun. 1, 1999

[54] METHOD OF FORMING A COATING OF GLASS-LIKE CARBON ON TITANIUM METAL

[75] Inventors: Koichi Tanaka; Shinichi Tanaka; Noriyoshi Tsuji, all of Osaka, Japan

[73] Assignee: Tanaka Limited, Osaka, Japan

[21] Appl. No.: 09/085,042

[22] Filed: May 27, 1998

[30] Foreign Application Priority Data

May 28, 1997 [JP] Japan ..................................... 9-138665
May 12, 1998 [JP] Japan ................................... 10-129025

[51] Int. Cl.$^6$ ............................... B05D 3/06; C23C 16/26

[52] U.S. Cl. ......................... 427/535; 427/577; 427/327; 427/122

[58] Field of Search .................................. 427/535, 577, 427/327, 122

[56] References Cited

U.S. PATENT DOCUMENTS 5,162,962  11/1992  Yamauchi et al. .................. 360/130.34
5,466,305  11/1995  Sato et al. ................................ 148/222

*Primary Examiner*—Roy V. King
*Attorney, Agent, or Firm*—Wenderoth, Lind & Ponack, L.L.P.

[57] ABSTRACT

A method of forming a sufficiently thin, highly amorphous and homogeneous glass-like carbon film on the surface of a titanium metal with high efficiency. In this method, the surface of a titanium metal is polished by e.g. buffing with emery paper and alumina or chromium suspension as polishing agents to form a mirror surface. A dense and rigid titanium oxide film layer is formed on the mirror surface. The surface of the titanium oxide film is then subjected to plasma heating in an atmosphere containing a hydrocarbon gas under a gas pressure of 0.1–30 Torr at 400–1100° C. to form a glass-like carbon film thereon.

1 Claim, 3 Drawing Sheets

METHOD OF FORMING A COATING OF GLASS-LIKE CARBON ON TITANIUM METAL

BACKGROUND OF THE INVENTION

This invention relates to a method of forming a coating of glass-like carbon on titanium metal.

Titanium metal is heat-resistant and high in specific strength. In the air, an oxide film is formed on its surface, making titanium metal corrosion-resistant. Pure titanium can be alloyed with any metal, especially copper, tin, iron, aluminum, vanadium, chromium, cobalt, molybdenum and nickel. By alloying, it is possible to improve its workability, mechanical strength and other properties.

Titanium metals, i.e. pure titanium and titanium alloys are active metals, so that their surfaces are oxidized soon in the air, forming a film of titanium oxide thereon. Protected by such titanium oxide films, the titanium metals show high corrosion resistance even under corrosive environments. Thus, titanium oxide films formed on titanium metals are called passivated films.

The present inventors developed a material useful as sliding members and tightening members such as bolts and nuts obtained by cleaning the surface of a titanium metal to remove an oxide film, followed by carburizing to reduce friction and wear coefficients. A method for manufacturing such a material is disclosed in unexamined Japanese patent publication 7-90542.

Glass-like carbon is a nondirectional aggregation of hexagonal structure with a side of several nanometers, which are basic units of a graphite material. It is a kind of carbon having a nearly amorphous structure with its graphite units never growing even when heated to around 3000° C. (hard-to-graphitize carbon). Such highly amorphous glass-like carbon has various industrially desirable properties including high corrosion resistance, wear resistance, lubricity (low friction coefficient), releasability, and gas impermeability.

In a conventional method for forming a glass-like carbon article, a thermosetting resin such as phenol is molded into a desired shape, polymerized, thermally set, machined, and heated very slowly while strictly controlling temperature for carbonization.

It would be possible to form a glass-like carbon film on the surface of a metal using this conventional method, i.e. by forming a thermosetting resin coating on the metal surface and heating it for a long time while controlling the temperature.

But with this method, it is difficult to form a homogeneous glass-like carbon film on the surface of a titanium metal due to the formation of a layer in which substrate metal and glass-like carbon are mixed together or the formation of a carbide of substrate metal. It is also difficult to form a sufficiently thin glass-like carbon film on the metal surface with high efficiency.

An object of this invention is to form a highly amorphous and homogeneous glass-like carbon film on the surface of a titanium metal with high efficiency and desired thinness.

Another object is to provide a method of forming a coating of glass-like carbon on a titanium metal article with high efficiency to improve the corrosion resistance, wear resistance (friction coefficient), releasability, gas impermeability and bio-affinity of titanium metal, thereby providing a surface treatment method that can increase the industrial value of titanium metals.

SUMMARY OF THE INVENTION

According to this invention, there is provided a method of forming a coating of glass-like carbon on a titanium metal comprising the steps of forming a dense film of a titanium oxide on the surface of a titanium metal, and forming said glass-like carbon coating on said titanium oxide film by subjecting the surface of the titanium oxide film to plasma heating in an atmosphere containing a hydrocarbon gas under gas pressure of 0.1–30 Torr at 400–1100° C.

This invention also provides a method of forming a coating of glass-like carbon on a titanium metal comprising the steps of polishing the surface of a titanium metal into a mirror surface, forming a titanium oxide film on said mirror surface, and forming said glass-like carbon coating on said titanium oxide film by subjecting the surface of the titanium oxide film to plasma heating in an atmosphere containing a hydrocarbon gas under gas pressure of 0.1–30 Torr at 400–1100° C.

The surface of the titanium metal is preferably mirror-finished by buffing using emery paper and alumina and chromium oxide suspensions as polishing agents.

According to this invention, an extremely dense and rigid titanium oxide film is formed on the surface of a titanium metal. The titanium oxide used in the invention may be titanium oxide (II) (TiO), titanium oxide (III) ($Ti_2O_3$) or titanium oxide (IV) ($TiO_2$).

A dense protective film of a titanium oxide can be formed by polishing, preferably buffing, the titanium metal surface into such an extremely fine and flat surface, i.e. an optically reflecting mirror surface that it is possible to perceive that the surface is a mirror surface even with the naked eye. Alternatively, it is possible to form an extremely dense titanium oxide film composed mainly of e.g. titanium oxide (IV) not by mirror-finishing but by oxidizing a titanium metal in the air kept at normal or elevated temperature, or in a forced oxidizing atmosphere.

Such a dense titanium oxide film prevents or limits the infiltration (carburization) of activated carbon ions into the titanium metal during plasma heating treatment in a predetermined atmosphere under predetermined conditions. Instead, highly amorphous carbon deposits on the surface of the titanium oxide film, forming a highly amorphous, homogeneous, thin glass-like carbon film on the titanium oxide film.

The titanium metal used in this invention may be pure titanium, a titanium alloy or an intermetallic compound of titanium and another metal.

The titanium metal surface is polished into a mirror surface to form an extremely dense and rigid oxide film. Such a mirror surface may be formed by any known polishing method such as buffing, machine polishing or chemical polishing. Good results were obtained when the titanium metal was buffed using emery paper and an alumina or chromium oxide suspension as polishing agents.

The titanium metal surface is mirror-finished before the plasma heating step. Immediately before plasma heating, the titanium metal surface is immersed in an organic solvent or subjected to ultrasonic cleaning.

Plasma heating may be carried out using a known carburizing device (made by NDK, Incorporated) having a furnace formed with a chamber made of heat insulating material containing graphite fiber. Specifically, the chamber is heated by a graphite rod as a heating element with the anode of a DC glow discharge connected to the top of the chamber and its cathode to the support table, while introducing processing or cleaning gas such as hydrocarbon, nitrogen, argon or hydrogen into the chamber through gas manifolds in a dispersed manner.

Specifically, the plasma heating according to this invention may be carried out as follows.

The titanium metal is put into the chamber, the chamber is evacuated and heated to 400–1100° C. by a heater, cleaning gas containing inert gas such as argon or nitrogen gas and hydrogen gas for dilution is introduced, and a high DC voltage of 200–1500 V is applied for 10–30 minutes.

The gas introduced into the chamber turns into a plasma. While the potential in the plasma is mostly uniform from anode to cathode, it drops rapidly near the cathode. Due to the cathode fall, hydrogen ions $H^+$ and argon ions $Ar^+$ are accelerated and collide against the titanium metal surface, thus knocking off any objects stuck on the metal surface. The metal surface is thus cleaned. But even with the sputtering by argon and hydrogen, the mirror-finished oxide film will remain because the film is extremely dense and fixed strongly to the metal substrate.

By introducing a hydrocarbon gas such as methane or propane gas under pressure of 0.1–30 Torr, activated carbon ions $C^+$ are produced in the plasma gas and deposit on the titanium metal surface.

A hydrocarbon gas is a generic name for any gas consisting of carbon and hydrogen, and the hydrocarbon gas used in this invention may be a chain hydrocarbon compound or a cyclic hydrocarbon compound. Typical chain hydrocarbon compounds usable in this invention include paraffinic hydrocarbon represented by $C_nH_{2n+2}$, olefinic hydrocarbon ($C_nH_{2n}$) and acetylenic hydrocarbon ($C_nH_{2n-2}$). They may be either straight-chained or branched. Methane, ethane, propane and butane are especially preferable because these gases remain gaseous at normal temperature and thus there is no need of any evaporation equipment. If a cyclic hydrocarbon is used, it may be a aromatic or an alicyclic compound. Benzene ($C_6H_6$) is a typical aromatic compound.

In order to form a glass-like carbon film on the surface of a titanium metal, the pressure of the hydrocarbon gas should be maintained at 0.1–30 Torr during plasma heating. If lower than 0.1 Torr, the amount of carbon in the film tends to be too low to form a complete film. On the other hand, a pressure higher than 30 Torr is impractical. More preferably, the pressure of the hydrocarbon gas should be 0.1–20 Torr.

The atmospheric temperature during plasma heating should be kept at 400–1100° C. If lower than 400° C., the adhesion of glass-like carbon to the titanium metal surface tends to be low. On the other hand, in view of the strength of titanium, a temperature higher than 1100° C. is impractical.

Other features and objects of the present invention will become apparent from the following description made with reference to the accompanying drawings, in which:

DETAILED DESCRIPTION OF THE PREFERRED EMBODIMENT

A 30 mm-square, 3 mm-thick flat plate of a β type titanium alloy (Ti-15V-3Al-3Cr-3Sn) was prepared, and its surface was polished with a 1200 emery paper, and then mirror-finished by buffing using an alumina ($Al_2O_3$) suspension as a polishing agent, followed by ultrasonic cleaning in acetone. The plate was then subjected to plasma heating under the following conditions using a device described below.

That is, plasma heating was carried out using a known carburizing device (made by NDK, Incorporated) having a furnace formed with a chamber made of heat insulating material. Specifically, the chamber was heated by use of a graphite rod as a heating element with the anode of a DC glow discharge connected to the top of the chamber and its cathode to the support table, while introducing processing or cleaning gas such as hydrocarbon, nitrogen, argon or hydrogen into the chamber through gas manifolds.

Plasma heating conditions were: gas composition: 100% propane gas, gas pressure: 1 Torr, heating time: 90 minutes, heating temperature: 800° C. After plasma heating, nitrogen gas was introduced under pressure into the chamber to cool the atmospheric temperature in the chamber to normal temperature.

For the metal piece specimen thus treated, the composition and crystal structure of the film formed on the surface of metal piece were determined by 1) semiquantitative analysis using an X-ray microanalyzer (EPMA), 2) Raman spectroscopic analysis, and 3) ESCA wide-area spectrum using X-ray photoelectron spectroscopic analysis.

For the results of 1), the chemical composition (wt %) near the superficial glossy film was:

Ti: 54%, C: 28%, V: 13%, Sn: 3%, Al: 1%, O: 0.4%

The chemical composition of the β type titanium alloy substrate was:

Ti: 64%, C: 2%, V: 22%, Sn: 5%, Al: 3%, O: 1%, Si: 2%

The above results clearly show that components detected near the superficial glossy film, are found to be only oxygen and carbon except chemical elements originating from β type titanium alloy substrate. Thus, it is apparent that no carbide, i.e. a compound of titanium alloy and carbon, was not produced.

For Raman spectroscopic analysis, Raman spectrum was measured with a Raman microspectroscope (made by Renishaw) to determine carbon structure by irradiating excited $Ar^+$ laser beam under the following conditions:

Excited $Ar^+$ laser beam: 514.5 nm

Microscope magnification: ×50

Irradiation time: 10 seconds

Figure 1:
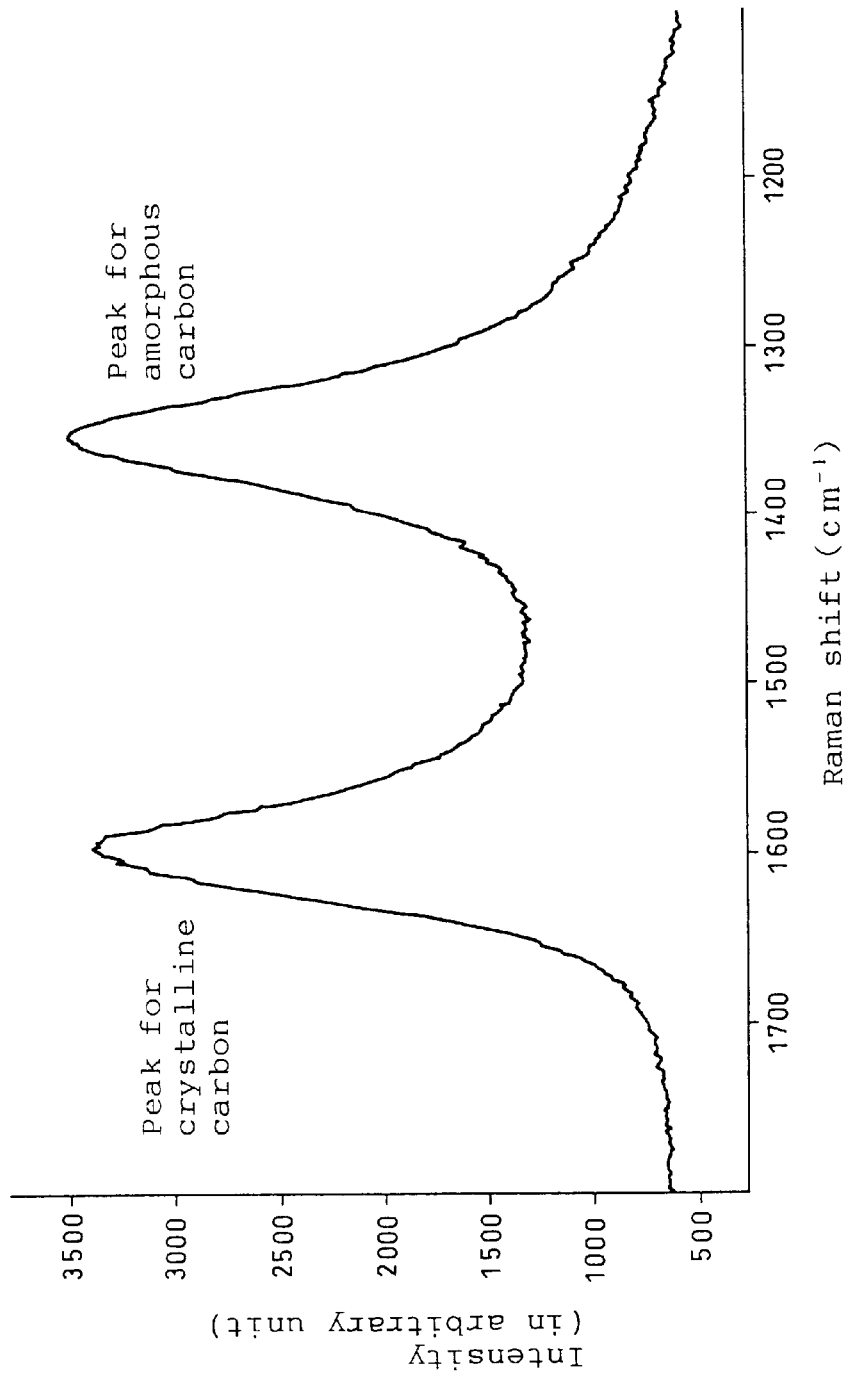
FIG. 1 is a graph showing a spectrum on the surface of the example obtained by Raman spectroscopic analysis.

Referring to FIG. 1, which shows the results of analysis 2), the peak of Raman spectrum originating from the crystalline carbon is present near 1580 $cm^{-1}$ and the peak originating from the amorphous carbon is near 1350 $cm^{-1}$. Since these peaks coincide with the peaks of typical glass-like carbon, it is apparent that the film formed on the surface of the metal piece specimen was a glass-like carbon film.

Figure 2:
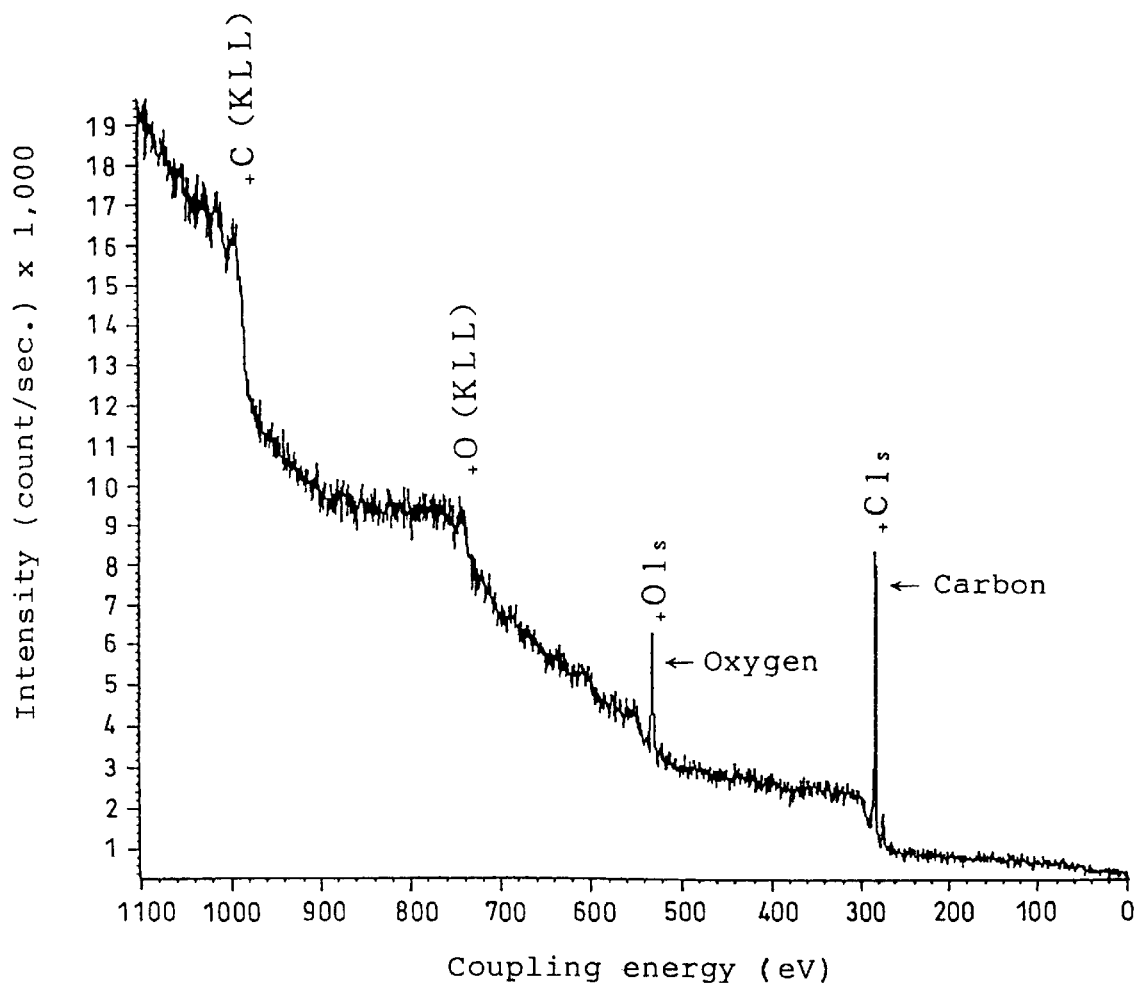
FIG. 2 is a graph showing an ESCA wide-area spectrum of the example obtained by X-ray photoelectron spectroscopic analysis.
Figure 3:
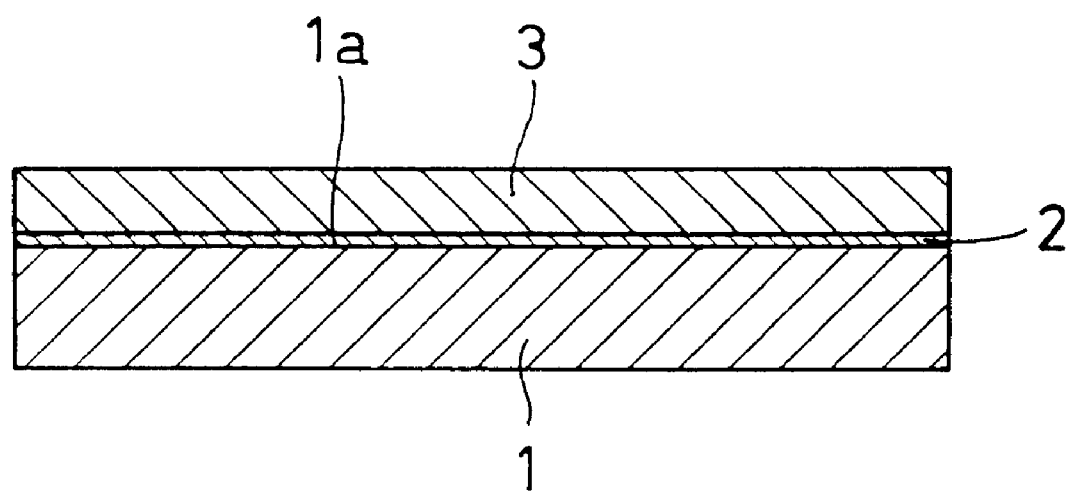
FIG. 3 is a sectional view of the film of the example.

Referring to FIG. 2, which shows the results of analysis 3, the intensity peaks of ESCA wide-area spectrum are present near 285 eV, which indicates the presence of carbon, and near 532 eV, which indicates the presence of oxygen. Thus, only carbon and oxygen were detected. From these results, as shown in FIG. 3, it is apparent that on the metal piece of the example a glass-like carbon film 3 having a uniform thickness is formed on a titanium oxide film layer 2 formed on a mirror-finished surface 1a of the titanium metal substrate 1.

With the method of this invention, it is possible to form a highly amorphous, homogeneous, dense and thin glass-like carbon film on the surface of a titanium metal with high efficiency.

The glass-like carbon film improves the corrosion resistance, wear resistance, lubricity (low friction coefficient), releasability, gas impermeability and bio-affinity of titanium metal, thereby increasing the industrial value of titanium metals.

What is claimed is:

1. A method of forming a coating of glass-like carbon on a titanium metal comprising the steps of polishing the surface of the titanium metal into a mirror surface, forming a titanium oxide film on said mirror surface to prevent carbon ions from diffusing into said titanium metal, and subjecting the surface of said titanium oxide film to plasma heating in an atmosphere containing a hydrocarbon gas under a gas pressure of 0.1–30 Torr at a temperature of 400–1100° C. to form a wear-resistant, corrosion-resistant coating of amorphous glass-like carbon.

* * * * *